(12) United States Patent
Higuchi

(10) Patent No.: US 8,525,627 B2
(45) Date of Patent: Sep. 3, 2013

(54) PERMANENT-MAGNET MAGNETIC FIELD GENERATOR

(75) Inventor: Dai Higuchi, Tokyo (JP)

(73) Assignee: Shin_Etsu Chemical Co., Ltd., Tokyo (JP)

( * ) Notice: Subject to any disclaimer, the term of this patent is extended or adjusted under 35 U.S.C. 154(b) by 174 days.

(21) Appl. No.: 12/715,793

(22) Filed: Mar. 2, 2010

(65) Prior Publication Data
US 2010/0219918 A1   Sep. 2, 2010

(30) Foreign Application Priority Data

Mar. 2, 2009   (JP) ................................. 2009-047819

(51) Int. Cl.
*H02K 21/26* (2006.01)
*H02K 21/38* (2006.01)
*H02K 23/04* (2006.01)
*H01F 7/02* (2006.01)

(52) U.S. Cl.
USPC ................... 335/306; 310/154.49; 310/154.01

(58) Field of Classification Search
USPC ............... 335/302, 306; 310/154.01, 154.33, 310/154.49
See application file for complete search history.

(56) References Cited

U.S. PATENT DOCUMENTS

| | | | | |
|---|---|---|---|---|
| 4,758,813 A * | 7/1988 | Holsinger et al. | ........... | 335/306 |
| 4,862,128 A * | 8/1989 | Leupold | ........... | 335/306 |
| 4,994,778 A * | 2/1991 | Leupold | ........... | 335/306 |
| 5,444,207 A * | 8/1995 | Sekine et al. | ........... | 219/121.43 |
| 5,523,732 A * | 6/1996 | Leupold | ........... | 335/306 |
| 6,054,789 A * | 4/2000 | Leupold | ........... | 310/156.43 |
| 6,169,352 B1 * | 1/2001 | Hull | ........... | 310/216.062 |
| 6,304,017 B1 * | 10/2001 | Leupold | ........... | 310/115 |
| 6,320,488 B1 * | 11/2001 | Leupold | ........... | 335/306 |
| 6,396,378 B1 * | 5/2002 | Leupold | ........... | 335/306 |
| 6,436,230 B1 * | 8/2002 | Kondo et al. | ........... | 156/345.46 |
| 6,535,092 B1 * | 3/2003 | Hurley et al. | ........... | 335/306 |

(Continued)

FOREIGN PATENT DOCUMENTS

| | | |
|---|---|---|
| EP | 1 557 848 A2 | 7/2005 |
| EP | 1 876 462 A1 | 1/2008 |

(Continued)

OTHER PUBLICATIONS

Japanese Patent Office Office Action Dated Jan. 7, 2013 for Corresponding Japanese Patent Application No. 2010-045216, English Translation of Office Action Attached.

(Continued)

*Primary Examiner* — Alexander Talpalatski
(74) *Attorney, Agent, or Firm* — Roberts Mlotkowski Safran & Cole, P.C.; David S. Safran

(57) ABSTRACT

A high-performance variable-magnetic-field dipole-ring magnetic circuit is provided. Specifically, provided is a permanent-magnet magnetic field generator having inner and outer dipole rings which share a central axis, and a yoke which surrounds the dipole rings, wherein a unidirectional variable magnetic field is generated in a space within the inner dipole ring. The generator has a fastener for fixing the inner dipole ring, and a rotator for allowing the outer dipole ring to rotate around the central axis. In the generator, each of the inner and outer dipole rings has a plurality of permanent magnets arranged in such a ring shape that a magnetization direction of the permanent magnets can make a full rotation per half circle of the ring.

8 Claims, 4 Drawing Sheets

(56) References Cited

U.S. PATENT DOCUMENTS

| | | | |
|---|---|---|---|
| 6,864,773 B2* | 3/2005 | Perrin | 335/306 |
| 6,989,730 B1* | 1/2006 | Leupold | 335/306 |
| 7,061,354 B1* | 6/2006 | Leupold | 335/285 |
| 7,167,067 B2* | 1/2007 | Higuchi | 335/301 |
| 7,347,221 B2* | 3/2008 | Berger et al. | 137/628 |
| 7,438,783 B2* | 10/2008 | Miyata et al. | 156/345.46 |
| 7,922,865 B2* | 4/2011 | Miyata et al. | 156/345.42 |
| 2004/0094509 A1* | 5/2004 | Miyata et al. | 216/70 |

FOREIGN PATENT DOCUMENTS

| | | |
|---|---|---|
| JP | 06-053177 A | 2/1994 |
| JP | 2005-56903 A | 3/2005 |
| JP | 2008-082663 A | 4/2008 |

OTHER PUBLICATIONS

Japanese Patent Office Decision of Rejection Dated Apr. 30, 2013 for Corresponding Japanese Patent Application No. 2010-045216, English Translation Decision of Rejection Attached.

* cited by examiner

PERMANENT-MAGNET MAGNETIC FIELD GENERATOR

BACKGROUND OF THE INVENTION

1. Field of the Invention

The present invention relates to a permanent-magnet magnetic field generator.

2. Description of the Related Art

A dipole-ring magnetic circuit comprises a plurality of magnet elements arranged in such a ring shape that the magnetization direction of the magnet elements can make a full rotation per half circle of the ring. The dipole-ring magnetic circuit is configured to generate a substantially unidirectional magnetic field in an internal space within the ring. Such a dipole-ring magnetic circuit is widely used, for example, for a magnetic resonance imaging (MRI) apparatus, a semiconductor device fabrication process, and a uniform magnetic field generator for fundamental research. Conventionally, normal electromagnets, superconducting electromagnets, or the like are used as a generator for generating a uniaxial uniform magnetic field. However, as a result of the recent development of high-performance rare earth permanent magnets, rare earth permanent magnets (hereinafter also referred to simply as "permanent magnets") have become dominantly used for uniform magnetic field generators for weak magnetic fields of, for example, 2 T or less.

One of features of a dipole-ring magnetic field generator is a capability of forming a magnetic field, which is substantially unidirectional and has substantially uniform strength, in an internal space within the magnetic field generator. Here, consider the angle of magnetic field vector (hereinafter referred to as a "skew angle") at each point in the internal space within the magnetic field generator, assuming that the direction of a NS magnetic field (Y-axis direction) generated in the space is 0°. Due to the characteristics of the magnetic field generator, the skew angle is substantially 0° near the central axis of the ring of the device, but tends to become worse, i.e., increase as the point becomes closer to the inner wall of the magnetic field generator. Thus, an effort has been made to reduce the skew angle (see Japanese Patent Application Unexamined Publication No. 2005-56903).

SUMMARY OF THE INVENTION

An object of the present invention is to provide a high-performance dipole-ring magnetic circuit capable of generating a variable magnetic field, which has been heretofore unachievable.

The present invention provides a variable-magnetic-field generator comprising two dipole rings having different outer diameters. The variable-magnetic-field generator can generate a variable magnetic field by fixing the inner dipole ring and rotating the outer dipole ring around the central axis of the inner diameter of the magnetic circuit.

Specifically, the present invention can provide a permanent-magnet magnetic field generator comprising inner and outer dipole rings which share a central axis, and a yoke which surrounds the dipole rings, wherein a unidirectional variable magnetic field is generated in a space within the inner dipole ring. The generator comprises a fastener for fixing the inner dipole ring, and a rotator for allowing the outer dipole ring to rotate around the central axis. Each of the inner and outer dipole rings has a plurality of permanent magnets arranged in a ring shape, and the plurality of permanent magnets in each of the dipole rings are arranged in such a way as to allow a magnetization direction of the permanent magnets to make a full rotation per half circle of the ring.

The present invention can also provide a method of generating a variable magnetic field using inner and outer dipole rings that share a central axis. The method comprises a step of rotating the outer dipole ring around the central axis with the inner dipole ring fixed so as to generate a unidirectional variable magnetic field in a space within an inner dipole ring.

The present invention makes it possible to easily fabricate a variable-magnetic-field dipole-ring magnetic field generator, and also to increase the size of the device for industrial use because the device is capable of stable driving without displacement due to vibration thereof.

BRIEF DESCRIPTION OF THE DRAWINGS

FIG. 2A shows the dipole-ring magnetic field generator before the start of the rotation of the dipole rings, whereas FIG. 2B shows the dipole-ring magnetic field generator after the start of the rotation thereof.

FIG. 3A shows the dipole-ring magnetic field generator before the start of the rotation of the dipole ring, whereas FIG. 3B shows the dipole-ring magnetic field generator after the start of the rotation thereof.

FIG. 5A is a plan view whereas FIG. 5B is a front view.

DETAILED DESCRIPTION OF THE PREFERRED EMBODIMENTS

Figure 1:
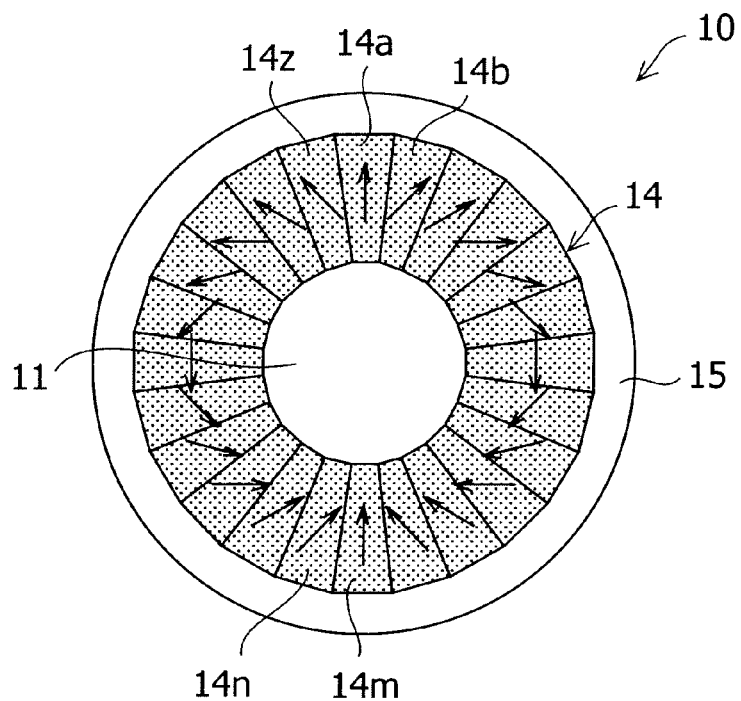
FIG. 1 is a cross-sectional view showing a dipole-ring magnetic field generator comprising one dipole ring, the view being taken along a plane perpendicular to the central axis of the dipole ring.
Figure 2A:
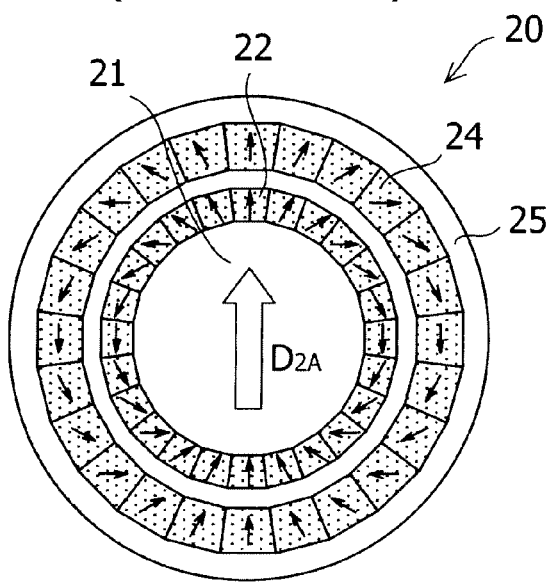
FIGS. 2A and 2B are each a cross-sectional view showing a dipole-ring magnetic field generator comprising two dipole rings that are rotated in directions opposite to each other, the view being taken along a plane perpendicular to the common central axis of the two dipole rings.
Figure 2B:
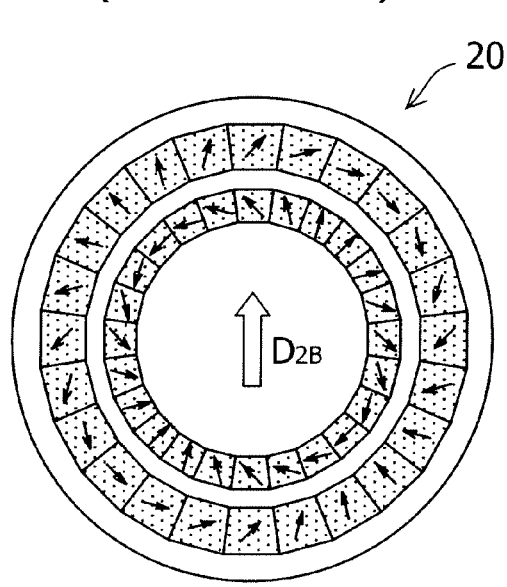

FIG. 1 is a cross-sectional view showing a dipole-ring magnetic field generator comprising one dipole ring, the view being taken along a plane perpendicular to the central axis of the dipole ring. FIGS. 2A and 2B are each a cross-sectional view showing a dipole-ring magnetic field generator comprising two dipole rings, the view being taken along a plane perpendicular to the common central axis of the two dipole rings.

FIG. 1 shows a dipole-ring magnetic field generator 10 comprising one dipole ring 14. The dipole-ring magnetic field generator 10 comprises constituent magnets 14a to 14z and a yoke 15 surrounding these magnets. The dipole-ring magnetic field generator 10 can generate a unidirectional magnetic field in an internal space 11 within the dipole ring 14.

FIGS. 2A and 2B show a dipole-ring magnetic field generator 20 comprising an inner dipole ring 22 and an outer dipole ring 24. These two dipole rings are rotated in directions opposite to each other. FIG. 2A shows the dipole-ring magnetic field generator 20 before the start of the rotation of the dipole rings 22 and 24, whereas FIG. 2B shows the dipole-ring magnetic field generator 20 after the start of the rotation thereof. The dipole-ring magnetic field generator 20 rotates the inner dipole ring 22 and the outer dipole ring 24 in the opposite directions and by the same phase, thereby generating a unidirectional, variable magnetic field in an internal space 21. The inner dipole ring 22 and the outer dipole ring 24 are surrounded by a yoke 25. $D_{2A}$ and $D_{2B}$ indicate magnitudes and directions of magnetic fields generated before and after the start of the rotation, respectively.

It is difficult to fabricate a single circular dipole ring, and it is even more difficult to fabricate a variable-magnetic-field dipole ring which has to be formed of dual dipole rings. For this reason, with conventional techniques, it has been possible to design an apparatus comprising a variable-magnetic-field dipole ring, but impossible to fabricate the apparatus for practical use.

As a result of designing a dipole-ring magnetic field generator to have a shape suitable for a uniform-magnetic-field space which is widely used industrially, and of further employing a structure that enables a variable magnetic field, the inventor of the present application has found that there are laws between outer circumferences and heights. In this way, the inventor has arrived at the present invention.

Figure 3A:
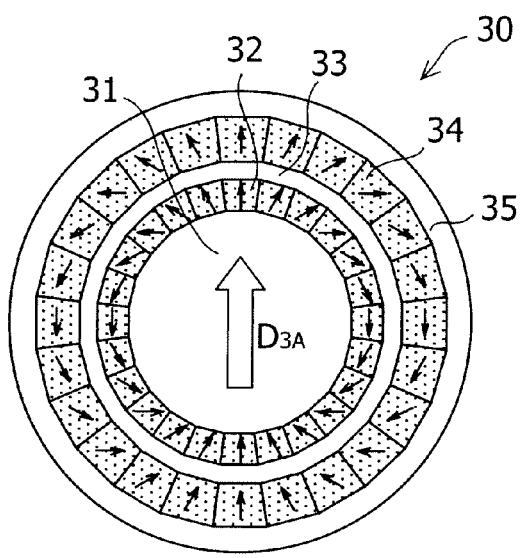
FIGS. 3A and 3B are each a cross-sectional view showing a dipole-ring magnetic field generator in which an inner dipole ring is fixed whereas an outer dipole ring is rotated, the view being taken along a plane perpendicular to the common central axis of the two dipole rings.
Figure 3B:
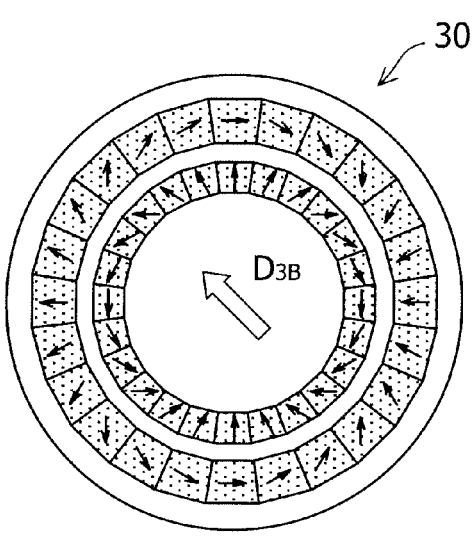

The present invention relates to a dipole-ring magnetic field generator comprising two dipole rings. As one of embodiments of the present invention, FIGS. 3A and 3B are each a cross-sectional view showing a dipole-ring magnetic field generator 30 comprising an inner dipole ring 32 and an outer dipole ring 34, the view being taken along a plane perpendicular to the central axis of the two dipole rings. The inner dipole ring 32 is fixed, whereas the outer dipole ring 34 is rotated. FIG. 3A shows the dipole-ring magnetic field generator 30 before the start of the rotation of the dipole ring 34, whereas FIG. 3B shows the dipole-ring magnetic field generator 30 after the start of the rotation thereof. The dipole-ring magnetic field generator 30 comprises dual dipole rings. When the outer dipole ring 34 is rotated while the inner dipole ring 32 is fixed, a magnetic field generated in an internal space 31 changes, thus generating a variable magnetic field. The inner dipole ring 32 and the outer dipole ring 34 are surrounded by a yoke 35. $D_{3A}$ and $D_{3B}$ indicate magnitudes and directions of magnetic fields generated before and after the start of the rotation, respectively.

The variable-magnetic-field dipole ring have the features that a magnetic field can be changed rapidly and the change of a magnetic field cannot result in an increase in the skew angle and a reduction in the magnetic field uniformity at the inner diameter side of the dipole ring.

Electromagnets or superconducting electromagnets, which are used for a general variable magnetic field apparatus, bring about poorer magnetic field uniformity and require greater time for magnetization and demagnetization than variable magnetic field dipoles, and are therefore not quite suitable for applications that require magnetic fields of homogeneous and various strengths. For this reason, for a constituent magnet, a substantially trapezoidal or fan-shaped rare earth permanent magnet which is selected from the group consisting of Nd—Fe—B type, Sm—Co type and Sm—N—Fe type may be preferably used.

A constituent magnet may be divided into, preferably, 4 to 60 sections. In consideration of the magnetic efficiency and the facilitation of the circuit fabrication, it may be more preferably divided into a range of about 12 to 36 sections. The magnets thus divided are formed into an integrated ring by a well-known method, e.g., being bonded with an adhesive such as an epoxy resin, or being placed in a case.

The sizes of the outer and inner diameters of the inner dipole ring and the sizes of the outer and inner diameters of the inner dipole ring may not be limited. The ratio ($T_i/T_o$) in which $T_i$ represents the thickness of the inner dipole ring and $T_o$ represents the thickness of the outer dipole ring may be preferably 0.7 to 1.0 in view of allowing the range of the strength of the variable magnetic field to be broadened. The thickness $T_i$ is the difference between sizes of the outer and inner diameters of the inner dipole ring, while the thickness $T_o$ is the difference between sizes of the outer and inner diameters of the outer dipole ring.

A yoke surrounds an inner dipole ring and an outer dipole ring. The yoke may be preferably made of a circular ferromagnetic or non-magnetic material. Use of the ferromagnetic material may slightly improve the magnetic efficiency as compared to use of the non-magnetic material. The ferromagnetic material may include iron and the like, and the non-magnetic material may include aluminum, SUS, resin and the like.

The yoke may preferably cover not only the inner and outer dipole rings, but also the entire magnetic field generator except for a part where an object to be treated enters into and exits from an internal space. Alternatively, the yoke may cover the entire magnetic field generator by providing an openable and closable door at this part.

The constituent magnets, which comprise permanent magnets, are respectively magnetized in the radial direction of the rings with a specific cycle. Every two of the constituent magnets located at opposite poles, when viewed from the central axis at the inner diameter side of the rings, are magnetized at an angular difference of 180°. Furthermore, adjacent constituent magnets are magnetized in different directions so that the magnetization direction of the constituent magnets may make a full rotation per half circle of the ring formed with the magnets.

A variable-magnetic-field dipole ring typically comprises a cylindrical space of a uniform magnetic field at the inner diameter side of a magnetic circuit, and the magnetic field in the space is used. Moreover, the variable-magnetic-field dipole ring is a magnetic field generator comprising outer and inner dipole rings, both of which generally employ the magnet arrangement shown in FIG. 1.

Rotation of the two dipole-rings in the opposite directions and by the same phase makes it possible to change desirably the magnetic field generated at the inner diameter side of the rings. In general, separate rotation mechanisms need to be installed respectively for the inner and outer dipole rings, and thus their rotation mechanisms are very intricate. Further, in order to rotate a magnetic field generator comprising two dipole rings, each of which generates a very strong magnetic field, a robust device having a strong rotational force corresponding to attraction and repulsion of the magnetic field needs to be installed in the magnetic field generator.

According to the present invention, the permanent-magnet magnetic field generator may preferably comprise a fastener for fixing an inner dipole ring, and a rotator for allowing an outer dipole ring to rotate around the central axis of the dipole rings when the central axis becomes a rotational central axis. By fixing the inner dipole ring, a mechanism for changing a magnetic field needs to be installed only for the outer dipole ring, thus reducing the number of the rotation mechanism by half.

The fastener for fixing the inner dipole ring may include, for example, a bolt and a weld. The fastener allows the inner dipole ring to be fixed to the frame of a fixing base. The frame needs to be made of a non-magnetic material at a part or parts near the dipole, but may be made of a ferromagnetic material such as iron at a part or parts away from the dipole. For example, a counter gear, a speed reducer and the like which are positioned away from the dipole may be made of a ferromagnetic material such as iron. This is advantageous in fabricating a large generator for which it is often difficult to provide enough non-magnetic material.

The rotational axis of the outer dipole ring has to completely coincide with the central axis of the inner diameter of the inner dipole ring. This is because the inner and outer dipole rings need to be always arranged concentrically for the purpose of improving uniformity in the variable magnetic field and of suppressing the skew angle. Accordingly, the outer dipole ring has to be rotated strictly without shifting its central axis.

The rotator may preferably comprise a rotation drive device and a rotational-force transmission mechanism for transmitting a rotational force of the rotation drive device. The outer dipole ring is rotatable through the rotational-force transmission mechanism.

The rotation drive device may preferably include a motor, a hydraulic pressure and an operator's hand (when the device is small).

The rotational-force transmission mechanism may preferably include a gear and a timing belt. For example, the rotational-force transmission mechanism may comprise an external gear (large gear) being provided to the outer-circumferential surface of the outer dipole ring, or to the outer-circumferential surface of the outer dipole ring with the yoke interposed therebetween; and a small gear (pinion gear) engaging with the external gear and being driven by the rotation drive device.

If the yoke is fixed to and integrated with the outer dipole ring, the external gear may be provided to the outer-circumferential surface of the outer dipole ring with the yoke interposed between the external gear and the outer-circumferential surface of the outer dipole ring. On the other hand, if the yoke is not fixed to the outer dipole ring, the external gear may be provided to the outer-circumferential surface of the outer dipole ring, a circular gear (internal gear) may be provided to the yoke, and a small gear can be provided in such a manner as to engage with the external and internal gears. Such a configuration makes the yoke rotate in conjunction with the outer dipole ring. In terms of reducing the dimensions of the rotation mechanism as much as possible and of simplifying the rotation mechanism, the yoke may be preferably fixed to and integrated with the outer dipole ring.

The rotation drive device may be attached to the base for fixing the inner dipole ring. Thus, the fixing base may have roles as a device for fixing the inner dipole ring and also as a device for fixing the rotation drive device for driving the outer dipole ring.

Preferably, at least one counter gear engaging with the external gear may be provided in a position which is rotationally symmetric to the small gear with respect to the central axis of the outer dipole ring.

For example, when one small gear and one counter gear are installed, it is preferable to arrange the counter gear having the same shape as that of the small gear in a position opposed to the position of the small gear when viewed from the rotation central axis of the outer dipole ring. To put it differently, assuming that the position of the small gear is set at 0°, the position of the counter gear is at 180° (half rotation). When one small gear and two counter gears are installed, the positions of the counter gears are respectively at 120° (one-third rotation) and at 240° (two-third rotation), assuming that the position of the small gear is set at 0°.

The shift or displacement of the central axis by the vibration of the device can be suppressed even when only one small gear is arranged in the rotation drive device. However, for a larger device having an increased rotational torque, a plurality of counter gears for holding the device may be arranged to suppress the shift or displacement of the central axis. Note that, having a purpose of suppressing the shift or displacement of the central axis, the counter gear may be provided separately from the rotational-force transmission mechanism, but may also be formed as a small gear having a rotational-force transmission function by being connected to the rotation drive device. Further, although the small gear may be made of a magnetic material or a non-magnetic material, it may be preferable to employ a magnetic material for the purpose of reducing a magnetic field leaked from the magnetic circuit.

Figure 4:
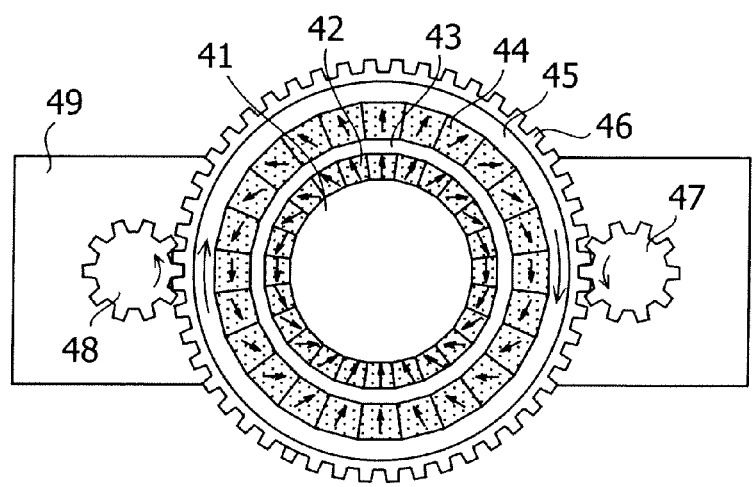
FIG. 4 shows an example of a dipole-ring magnetic field generator comprising a small gear and a counter gear.

FIG. 4 shows an example of a dipole-ring magnetic field generator comprising a small gear and a counter gear. FIG. 4 shows a dipole-ring magnetic field generator 40 comprising an inner dipole ring 42 and an outer dipole ring 44. In the dipole-ring magnetic field generator 40, the inner dipole ring 42 is fixed on a base 49. When the outer dipole ring 44 is rotated, a magnetic field generated in an internal space 41 changes, thereby generating a variable magnetic field. An external gear 46 is provided on the outer-circumferential surface of a yoke 45 fixed on the outer dipole ring 44. A small gear 47 driven by a rotation drive device (not shown) engages with the external gear 46. A counter gear 48 is provided in such a manner as to engage with the external gear 46, in a position where the outer dipole ring 44 makes a half rotation (180°) around its central axis from the position of the small gear 47. The external gear 46 and the counter gear 48 are fixed on the base 49.

The torque for a small generator with an inner diameter of 60 mm is typically 50 Nm, and the torque for a large generator with an inner diameter of 300 mm is typically 1000 Nm or less.

The rotation speed is not particularly limited to a specific value. However, in a case of a generator comprising an inner dipole ring having an inner diameter of 60 mm to 100 mm and an outer diameter of 120 mm to 200 mm, and an outer dipole ring having an inner diameter of 120 mm to 200 mm and an outer diameter of 280 mm to 300 mm, the rotation speed thereof may be preferably 1 rpm to 5 rpm, more preferably 1 rpm to 3 rpm, in consideration of the fact that there is no need to rapidly change a variable magnetic field generated in an internal space.

The rotational-force transmission mechanism may generally include manual, electric and hydraulic transmission mechanisms. A speed reducer may be used in combination with any of these mechanisms to reduce a driving force. Further, it may be desirable to arrange one or more rotational-force transmission mechanisms in accordance with the required rotational force.

In order to hold the rotation mechanism, in addition to suppression of the shift or displacement of the rotation central axis, the horizontal positions of the inner and outer dipole rings have to be strictly maintained. It may be therefore preferable to also use a horizontal plane holder.

A horizontal plane holder may include, but is not particularly limited to, a cam follower. The cam follower may be used for preventing the vertical displacement of the outer dipole ring. Here, the vertical displacement of the outer dipole ring means the displacement thereof with respect to the inner dipole ring in the front-and-back direction of the paper of FIG. 5A. Use of the cam follower not only enables position correction but also smoothes the rotation of the outer dipole ring. The cam follower may be preferably a weight (of preferably a non-magnetic material) for suppressing the vertical vibration of the magnets of the outer dipole ring.

Figure 5A:
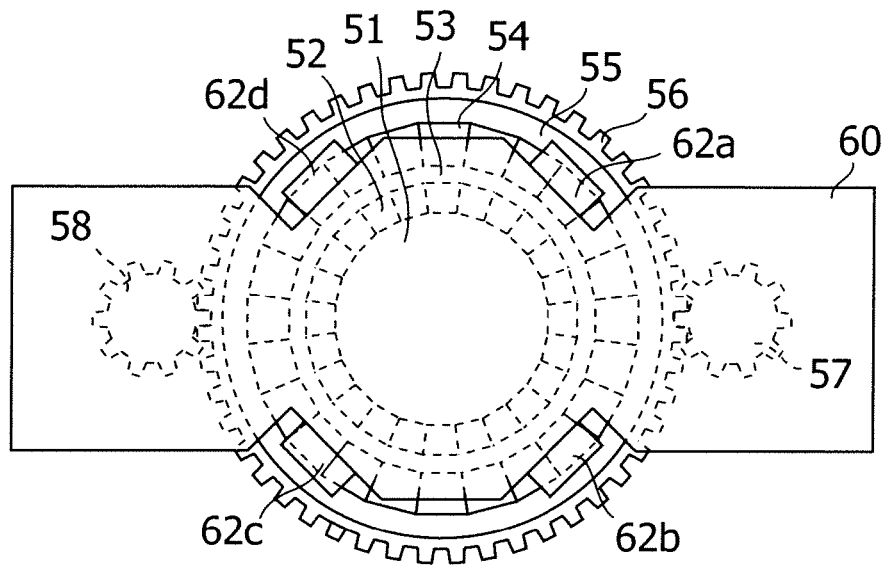
FIGS. 5A and 5B each show an example of a dipole-ring magnetic field generator comprising horizontal plane holders placed at the top and bottom of an outer dipole ring.
Figure 5B:
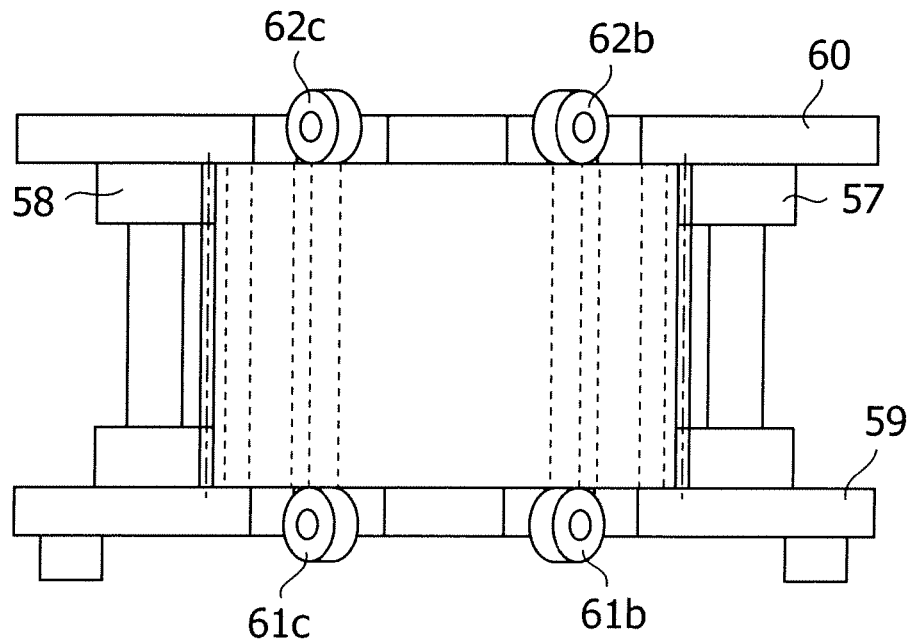

FIGS. 5A and 5B show an example of a dipole-ring magnetic field generator comprising horizontal plane holders placed at the top and bottom of an outer dipole ring. FIG. 5A is a plan view, whereas FIG. 5B is a front view. FIGS. 5A and 5B show a dipole-ring magnetic field generator 50 comprising an inner dipole ring 52 and an outer dipole ring 54. In the dipole-ring magnetic field generator 50, the inner dipole ring 52 is fixed not only on a base 59 but also on an upper-surface supporting plate 60. When the outer dipole ring 54 is rotated, a magnetic field generated in an internal space 51 changes, thereby generating a variable magnetic field. An external gear 56 is provided on the outer-circumferential surface of a yoke 55. A small gear 57 driven by a rotation drive device (not shown) engages with the external gear 56. A counter gear 58 is provided in such a manner as to engage with the external gear 56, in a position where the outer dipole ring 54 makes a half rotation (180°) around its central axis from the position of the small gear 57. The shaft of each of the small gear 57 and the counter gear 58 is fixed on the base 59 and the upper-surface supporting plate 60.

Four horizontal plane holders may be preferably installed at each of the top and bottom of the outer dipole ring 54 in such a manner as to be vertically symmetrical. Thus, the dipole-ring magnetic field generator 50 may preferably comprise four horizontal plane holders 61a to 61d on the base 59 and four horizontal plane holders 62a to 62d on the upper-surface supporting plate 60. It should be noted, however, that the arrangement of horizontal plane holders is not limited to the vertically-symmetrical arrangement of four horizontal plane holders at each of the top and bottom of the dipole ring, although the arrangement is preferably symmetrical. Four or more horizontal plane holders may be arranged as long as the arrangement is vertically and laterally symmetrical.

In general, the variable magnetic field mechanism of a variable-magnetic-field dipole ring may be constantly operated. For this reason, a friction-resistant ring for reducing rotational friction may be preferably provided in a friction part between the inner and outer dipole rings. Examples of a friction-resistant ring are a friction-resistant ring 33 of FIG. 3, a friction-resistant ring 43 of FIG. 4 and a friction-resistant ring 53 of FIG. 5.

The material for the friction-resistant ring is not particularly limited. However, the friction-resistant ring may be preferably made of a non-magnetic material so as not to deteriorate the magnetic field of the outer dipole ring. Preferable examples of the friction-resistant ring may include a bearing made of resin such as MC nylon or polyacetal, or of stainless steel.

The thickness of the friction-resistant ring for a large generator with an inner diameter of 300 mm or larger may be preferably up to about 50 mm. A space between the inner and outer dipole rings may be a closed space, and thus the friction-resistant ring does not need to be a single body, and may comprise separate parts.

The permanent-magnet magnetic field generator may preferably comprise a bearing for rotatably supporting the outer dipole ring. For example, in order to allow the outer dipole ring to rotate with the inner dipole ring fixed, a bearing may be provided between flange portions formed respectively to the inner and outer dipole rings.

The bearing may preferably include, but is not particularly limited to, a rolling bearing, a slide bearing, a magnetic bearing and a fluid bearing. The bearing may be provided in a single stage, or may be provided in two or more stages for the purpose of reducing the load from the rotation drive device such as a motor.

Figure 7:
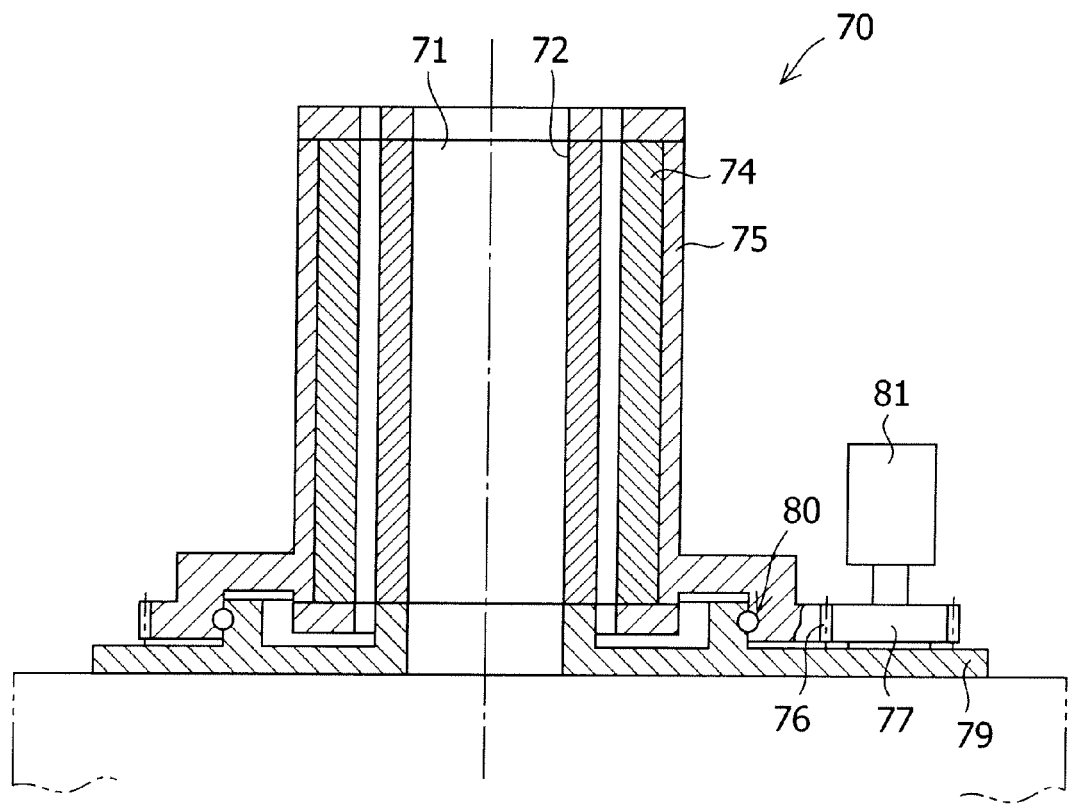
FIG. 7 shows an example of a dipole-ring magnetic field generator comprising a bearing.

FIG. 7 shows an example of a dipole-ring magnetic field generator comprising a ball bearing or a roller bearing. FIG. 7 shows a dipole-ring magnetic field generator 70 comprising an inner dipole ring 72 and an outer dipole ring 74, and being capable of generating a variable magnetic field in an internal space 71. In the dipole-ring magnetic field generator 70, the inner dipole ring 72 is fixed on a base 79, and the outer dipole ring 74 is arranged coaxially with the inner dipole ring 72 and is rotatably supported by a bearing 80. The power of a rotation drive device (for example, a motor 81) is transmitted to the outer dipole ring 74 via a small gear 77 coupled to the motor 81, and an external gear (large gear) 76 provided on the outer-circumferential surface of a yoke 75 fixed on the outer dipole ring 74. As a result, the outer dipole ring 74 is rotated in a predetermined direction.

EXAMPLE 1

Figure 6:
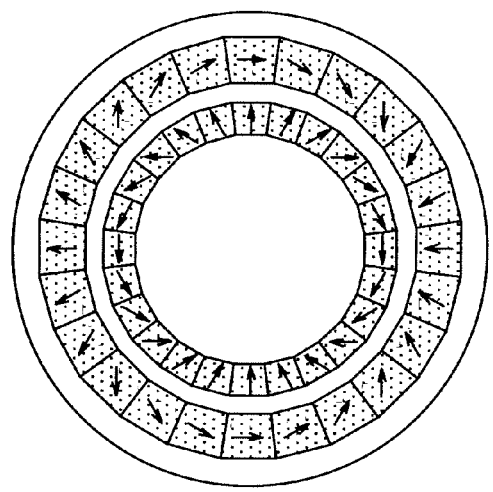
FIG. 6 shows a magnetization direction of each magnet of a dipole-ring magnetic field generator used in Example 1.

A dipole-ring magnetic field generator having the same structure as that of the generator shown in FIG. 5 was fabricated. The dipole-ring magnetic field generator comprised an inner dipole ring (inner diameter: 60 mm, outer diameter: 145 mm, height: 200 mm) and an outer dipole ring (inner diameter: 155 mm, outer diameter: 230 mm, height: 200 mm), and the magnetization direction of each permanent magnet (neodymium rare earth magnet) of the rings was same as those shown in FIG. 6. A ring being made of polyacetal resin and having a thickness of 5 mm was used as a friction-resistant ring. A spur gear (commercial product) made of carbon steel was used as a small gear of a driving transmission mechanism. A gear of the same type as the small gear was used as a counter gear and connected not to a motor but to the outer dipole ring.

The magnets of the outer dipole ring were rotated (at 2 rpm) with the magnets of the inner dipole ring fixed, and a magnetic field generated at the inner diameter side of the rings was measured. It should be noted here that, since the inner dipole ring is fixed, the direction of the generated magnetic field changes step by step. Accordingly, a main magnetic field was measured in the following way. First, the entire generator was placed on a turntable, and a Hall element was placed at the center of the inner diameter. Next, the entire device was rotated. Then, at a rotation position where the hall element detected the highest magnetic field, a magnetic field in a uniform magnetic field space was measured with a gauss meter. Here, the uniform magnetic field space took a shape of a cylinder having a diameter of 16.5 mm and a height of 33 mm, more specifically, a cylinder having a radius of 8.25 mm and extending by 16.5 mm vertically on either side from the center of the central axis of the two dipole rings (the middle point of the height of the rings on the central axis). Table 1 shows the results.

TABLE 1

| Rotational angle of outer dipole ring (degree) | Strength of magnetic field generated (tesla) | Skew angle (degree) | Uniformity of magnetic field at inner diameter side (%) |
| --- | --- | --- | --- |
| 0 | 0.493 | 0.35 | ±2.0 |
| 30 | 0.476 | 0.41 | ±2.0 |
| 60 | 0.428 | 0.61 | ±2.1 |

TABLE 1-continued

| Rotational angle of outer dipole ring (degree) | Strength of magnetic field generated (tesla) | Skew angle (degree) | Uniformity of magnetic field at inner diameter side (%) |
|---|---|---|---|
| 90 | 0.350 | 0.87 | ±2.2 |
| 120 | 0.260 | 1.03 | ±2.5 |
| 150 | 0.153 | 1.18 | ±3.1 |
| 180 | −0.008 | 1.24 | ±4.0 |
| 210 | 0.151 | 1.17 | ±3.2 |
| 240 | 0.255 | 1.07 | ±2.5 |
| 270 | 0.357 | 0.88 | ±2.1 |
| 300 | 0.432 | 0.65 | ±2.0 |
| 330 | 0.477 | 0.45 | ±2.0 |

As shown in Table 1, it was found out that the magnetic field changed from 0 T to about 0.5 T in accordance with the rotation of the outer dipole ring. It was also found out that the uniformity of magnetic field and the skew angle indicating the magnetic field orientation were both favorable at any strength of the magnetic field generated from the variable magnetic field circuit.

The magnetic field generator of the present invention can easily generate a variable magnetic field in an internal space, and is thus advantageous for a magnet fabrication process, a semiconductor heat-treatment process in a magnetic field, a silicon semiconductor fabrication process, and the like.

What is claimed is:

1. A permanent-magnet magnetic field generator comprising:
    inner and outer dipole rings which share a central axis,
    a yoke which surrounds the dipole rings,
    a fastener for rotationally fixing the inner dipole ring relative to the central axis, and
    a rotator for allowing the outer dipole ring to rotate around the central axis, wherein
    a unidirectional variable magnetic field is generated in a space within the inner dipole ring,
    each of the inner and outer dipole rings has a plurality of permanent magnets arranged in a ring shape, and
    the plurality of permanent magnets in each of the dipole rings are arranged in such a way as to allow a magnetization direction of the permanent magnets to make a full rotation per half circle of the ring.

2. The permanent-magnet magnetic field generator according to claim 1, said rotator comprises a rotation drive device and a rotational-force transmission mechanism for transmitting a rotational force of the rotation drive device.

3. The permanent-magnet magnetic field generator according to claim 2, wherein said rotational-force transmission mechanism comprises
    an external gear provided to an outer-circumferential surface of said outer dipole ring, or an external gear provided to an outer-circumferential surface of said outer dipole ring with said yoke interposed therebetween; and
    a small gear engaging with the external gear and being driven by the rotation drive device.

4. The permanent-magnet magnetic field generator according to claim 3, further comprising at least one counter gear which engages with said external gear and is located in a position which is rotationally symmetric to a position of said small gear with respect to the central axis.

5. The permanent-magnet magnetic field generator according to claim 1, further comprising a bearing for rotatably supporting said outer dipole ring.

6. The permanent-magnet magnetic field generator according to claim 1, further comprising a friction-resistant ring between said inner and outer dipole rings so as to reduce rotational friction.

7. The permanent-magnet magnetic field generator according to claim 1, further comprising a horizontal plane holder to maintain horizontal positions of the inner and outer dipole rings.

8. The permanent-magnet magnetic field generator according to claim 1, wherein said rotator is adapted to rotate the outer dipole ring around the fixed inner dipole ring in a manner adapted to produce a uniform magnetic field space having the shape of a cylinder.

* * * * *

UNITED STATES PATENT AND TRADEMARK OFFICE
CERTIFICATE OF CORRECTION

| | | |
|---|---|---|
| PATENT NO. | : 8,525,627 B2 | Page 1 of 1 |
| APPLICATION NO. | : 12/715793 | |
| DATED | : September 3, 2013 | |
| INVENTOR(S) | : Higuchi | |

It is certified that error appears in the above-identified patent and that said Letters Patent is hereby corrected as shown below:

On the Title Page

Item [73] Assignee should read: Shin-Etsu Chemical Co., Ltd.

Signed and Sealed this
Twenty-fifth Day of March, 2014

Michelle K. Lee
*Deputy Director of the United States Patent and Trademark Office*